(12) United States Patent
Venema et al.

(10) Patent No.: US 7,233,384 B2
(45) Date of Patent: Jun. 19, 2007

(54) LITHOGRAPHIC APPARATUS AND DEVICE MANUFACTURING METHOD, AND DEVICE MANUFACTURED THEREBY FOR CALIBRATING AN IMAGING SYSTEM WITH A SENSOR

(75) Inventors: Willem Jurrianus Venema, Eindhoven (NL); Anastasius Jacobus Anicetus Bruinsma, Delft (NL); Joeri Lof, Eindhoven (NL); Eduardus Johannes Gerardus Boon, Weert (NL)

(73) Assignee: ASML Netherlands B.V. (NL)

( * ) Notice: Subject to any disclaimer, the term of this patent is extended or adjusted under 35 U.S.C. 154(b) by 87 days.

(21) Appl. No.: 11/150,882

(22) Filed: Jun. 13, 2005

(65) Prior Publication Data

US 2006/0279719 A1 Dec. 14, 2006

(51) Int. Cl.
*G03B 27/42* (2006.01)
*G03B 27/74* (2006.01)
*G03B 27/32* (2006.01)

(52) U.S. Cl. .............................. 355/53; 355/68; 355/77
(58) Field of Classification Search ................. 355/53, 355/67, 68, 77; 430/30, 311
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,379,867 B1 * | 4/2002 | Mei et al. | 430/296 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2004/0189970 A1 * | 9/2004 | Takada | 355/67 |
| 2005/0007572 A1 | 1/2005 | George et al. | |
| 2005/0062948 A1 * | 3/2005 | Van Der Mast et al. | 355/53 |

FOREIGN PATENT DOCUMENTS

WO  WO 98/33096  7/1998
WO  WO 98/38597  9/1998

* cited by examiner

*Primary Examiner*—Alan Mathews
(74) *Attorney, Agent, or Firm*—Sterne, Kessler, Goldstein & Fox P.L.L.C.

(57) ABSTRACT

A lithographic apparatus comprises an illumination system, an array of individually controllable elements, a projection system, a substrate table, and a sensor system. The illumination system supplies a beam of radiation. The array of individually controllable elements patterns the beam. The projection system projects the patterned beam onto a target plane, the patterned beam comprising an array of radiation spots. The substrate table supports a substrate, such that a target surface of the substrate is substantially coincident with the target plane. The sensor system comprises an array of detector elements arranged to receive at least one of the spots. The sensor system measures an energy of the or each received spot and provides an output signal indicative of the energy of the or each received spot.

20 Claims, 9 Drawing Sheets

Figure 1:
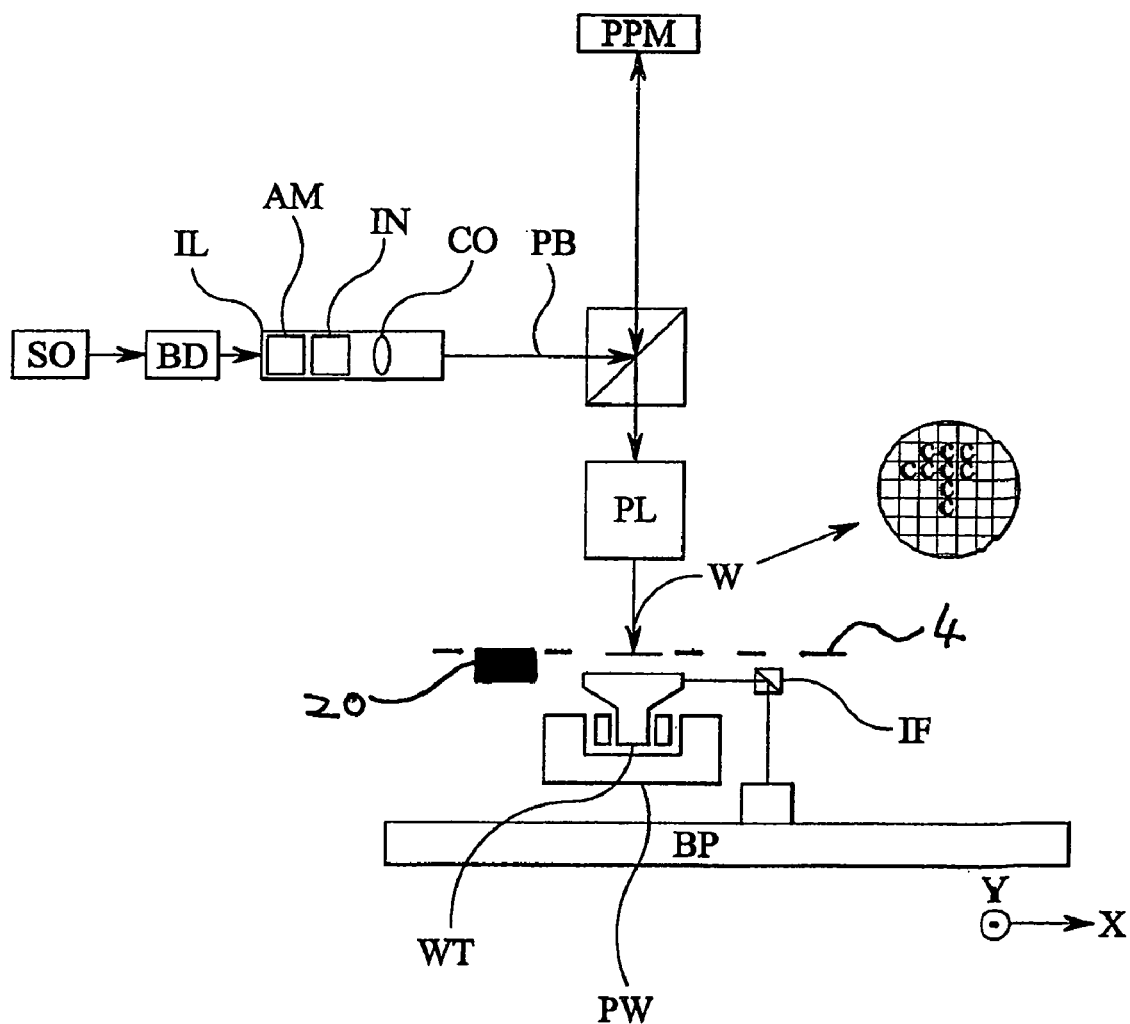

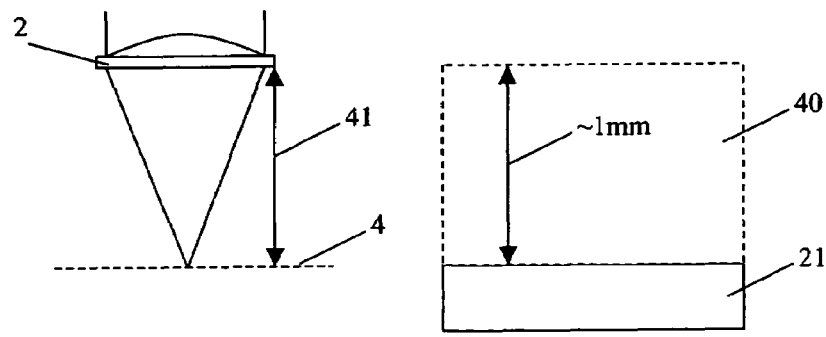
Fig 8
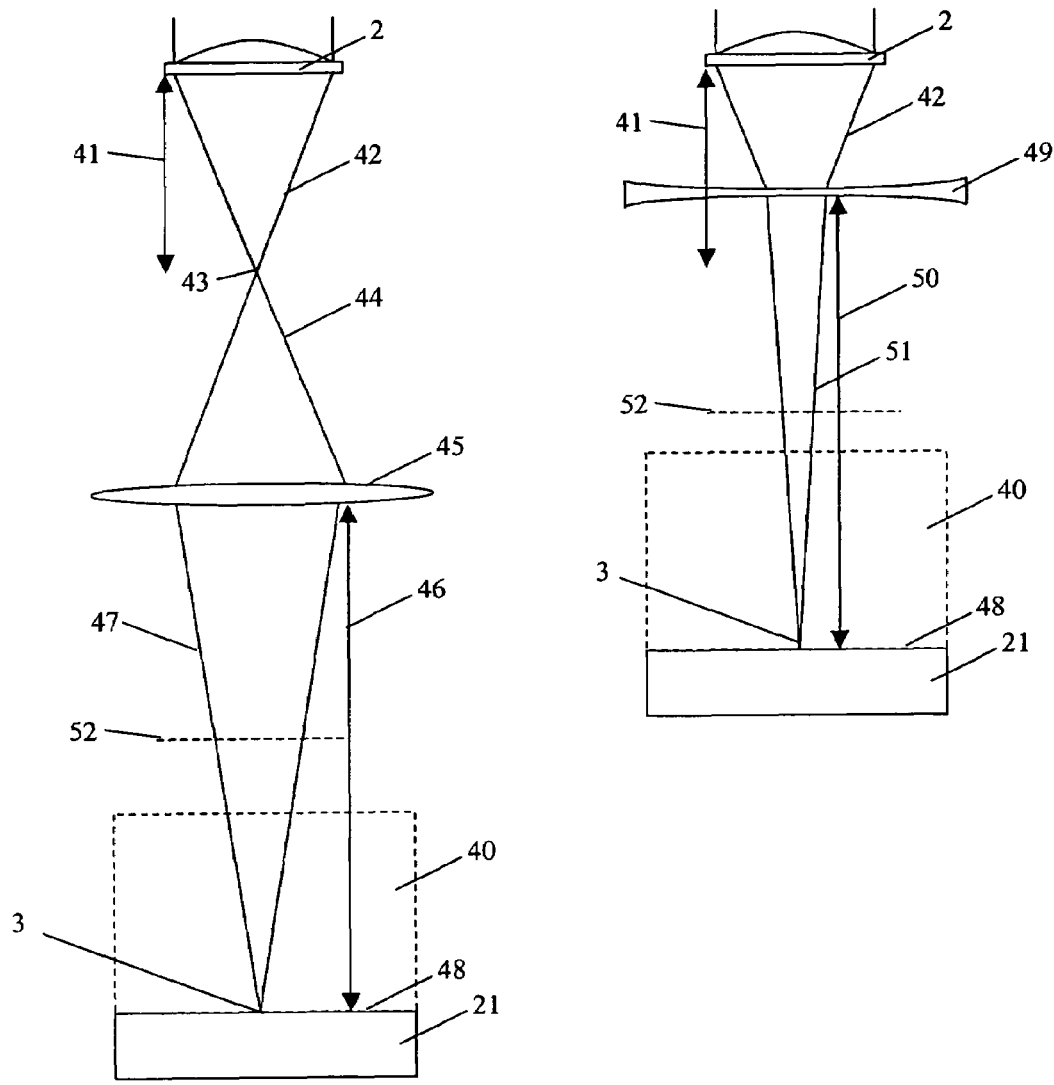
Fig 9
Fig 10

LITHOGRAPHIC APPARATUS AND DEVICE MANUFACTURING METHOD, AND DEVICE MANUFACTURED THEREBY FOR CALIBRATING AN IMAGING SYSTEM WITH A SENSOR

BACKGROUND

1. Field of the Present Invention

The present invention relates to a lithographic apparatus, a device manufacturing method, and a device manufactured thereby.

2. Related Art

A lithographic apparatus is a machine that applies a desired pattern onto a target portion of a substrate. Lithographic apparatuses can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of, one or several dies) on a substrate (e.g., a silicon wafer or glass plate) that has a layer of radiation-sensitive material (resist). Instead of a mask, the patterning means can comprise an array of individually controllable elements, which serve to generate the circuit pattern. This is generally referred to as maskless lithography.

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

In maskless lithography a beam of radiation illuminates the array of individually controllable elements. Each element can be controlled by a separate control signal, such that each element can assume one of a number of states. A desired pattern can thus be imparted to the cross section of the beam, that pattern being dependent upon the state of each element within the array. In cross section in a target plane, the projected pattern can be regarded as comprising an array of radiation spots formed by an array of sub-beams, with each spot corresponding to, and controlled by, an individual element or group of elements within the array. The energy of each spot is thus dependent upon the state of the corresponding individually controllable element or elements.

The lithographic apparatus can comprise a projection system arranged to project the patterned beam onto the target plane. In normal operation of the lithographic apparatus (i.e., when it is being used to project a pattern onto a target portion of a substrate) a target surface of the wafer containing the target portion is arranged to be substantially coincident with the target plane and in the path of the patterned beam. Consequently, an array of spots is projected onto the target portion of the substrate, each spot corresponding to an individual sub-beam. Measurement of the received radiation energy for each spot provides an indication of the radiation energy for the corresponding sub-beam. The energy of each spot is ultimately controlled by the corresponding individual element (or group of corresponding individual elements) within the array. Therefore, measurement of the energy of a spot provides an indication of the state of the corresponding individually controllable element(s). Measurement of the energy of the spots can be used to calibrate the array of individually controllable elements.

Each element within the array can be controlled such that it is fully on, fully off, or in one of a number of intermediate states, such that substantially all, substantially none, or an intermediate amount of the radiation incident upon that element is reflected or transmitted towards the target plane. Consequently, the energy of each spot at the target plane can vary according to the state of the corresponding element or elements.

Over time the performance of the lithographic apparatus, in particular the array of individually controllable elements, can become degraded. For instance, this degradation can be caused by contamination. Contamination can affect the performance of some elements more than others. Additionally, individual elements within the array can malfunction. The ability of each element to accurately change its state can vary over time. Consequently, the power of the radiation within each sub-beam may not accurately reflect the control signal supplied to the individually controllable element. It is desirable to be able to calibrate the array of individually controllable elements so as to detect and compensate for any malfunction or degradation.

One arrangement to calibrate the performance of the array of individually controllable elements could be to provide a dose sensor. A dose sensor can comprise a photodiode arranged to measure the radiation energy within a single spot illuminating the photodiode. Certain types of element malfunctions can result in the element being stuck in the fully on position (or an intermediate state) when the control signal indicates that it should be fully off. Therefore, it cannot be assumed that by providing the appropriate control signals to turn all but one element off, the only radiation received by the dose sensor will be from the remaining element. A single dose sensor may not be able to distinguish between radiation received from the element being measured and stray radiation received from other elements. Therefore, in order to exclude radiation from the other elements, a pinhole in a screen over the photodiode can be provided. The pinhole is sized such that only radiation from a single element can pass through.

In order to measure the energy of every spot the dose sensor can be aligned with each spot in turn. This provides considerable difficulties in aligning each spot accurately with the pinhole. Additionally, the sensor has to measure each spot for a minimum period of time in order to accurately measure its energy. Consequently, calibration of the whole array of individually controllable elements can be extremely time consuming.

With a dose sensor as described above, in order to calibrate the ability of each element at a range of element states then the energy of each spot must be measured separately a number of times. This further increases the amount of time required to calibrate the array.

Therefore, what is needed is a system and method that allow for a more effective determination for malfunction or degradation of an image spot.

SUMMARY

According to one embodiment of the present invention, there is provided a lithographic apparatus comprising an illumination system, an array of individually controllable elements, a projection system, a substrate table, and a sensor system. The illumination system supplies a beam of radiation. The array of individually controllable elements patterns the beam. The projection system projects the patterned beam onto a target plane, the patterned beam comprising an array of radiation spots. The substrate table supports a substrate, such that a target surface of the substrate is substantially coincident with the target plane. The sensor system comprises an array of detector elements arranged to receive at least one of the spots. The sensor system measures an energy of the or each received spot and provides an output signal indicative of the energy of the or each received spot.

In one example, because the sensor system comprises an array of detector elements there is no requirement for exactly aligning the sensor system with each spot. This significantly reduces the complexity of the sensor system and reduces the time taken to measure the energy of each spot.

In another example, the array of detector elements is arranged to receive a plurality of the spots, the sensor system is arranged to measure the energy of each of the plurality of received spots, and the output signal is indicative of the energy of each of the plurality of received spots. This allows for the energy of a plurality of spots to be measured simultaneously, reducing the time required to measure all of the spots within the array.

In a further example, the state of at least one individually controllable element can be variable and the energy of the or each corresponding received spot can be dependent upon the state, such that the output signal is indicative of the energy of the or each received spot for two or more states of the at least one individually controllable element. Consequently, each spot can be measured for a number of different states of the corresponding individually controllable element during a single measurement operation.

In still another example, the projection system and the sensor system can be arranged such that each spot illuminates a single respective detector element. Alternatively, the projection system and the sensor system can be arranged such that each of the plurality of spots illuminates a respective one of a plurality of detector elements.

In yet another example, at least one of the projection system and the sensor system is operable to adjust the area of the array of detector elements illuminated by the or each spot, such that the or each spot illuminates a plurality of detector elements and the output signal is indicative of the average energy of the or each spot. This allows for the accuracy of the measurement of the energy of each spot to be increased by increasing the area of the array of detector elements illuminated by each spot.

In a still further example, at least one of the projection system and the sensor system can be operable to adjust a size of the or each received spot. Alternatively, at least one of the projection system and the sensor system can be moveable such that the or each spot is projected onto the array of detector elements to illuminate a plurality of discrete images of the or each spot. The or each spot can be projected onto the array of detector elements to form a continuously illuminated stripe. The continuously illuminated stripe associated with a first spot can overlap with the continuously illuminated stripe associated with a second spot. The direction of relative movement between the projection system and the sensor system can be at an angle to an axis of the projected array of spots.

In yet a still further example, the sensor system is arranged to adjust the output signal with a correction factor corresponding to the proportion of the surface area of the array of detector elements capable of detecting incident radiation.

In another example, the sensor system can further comprise a sensor scanning system arranged to move the array of detector elements from a first sampling position to at least a second sampling position. A first plurality of spots can be received by the array of detector elements in the first sampling position and a second different plurality of spots are received by the array of detector elements in the second sampling position. Alternatively, at least some of a first plurality of spots received by the array of detector elements in the first sampling position can form part of a second plurality of spots received by the array of detector elements in the second sampling position. The degree of overlap between the first plurality of spots and the second plurality of spots can be a single column or row within the received sample array of spots. Alternatively, the degree of overlap can be approximately half or substantially the whole of the sample array of spots.

In a yet another example, the sensor system further comprises beam measurement means arranged to provide a signal indicative of the energy of the beam, the sensor system being further arranged to use the signal indicative of the energy of the beam to adjust the output signal. The beam measurement means can be arranged to measure the spatial distribution of energy across a cross section of the beam in order to generate a signal indicative of the variation of energy across the cross section of the beam for adjusting the output signal.

In yet a still further example, the lithographic apparatus can comprise a plurality of arrays of individually controllable elements.

In another example, the array of detector elements comprise a charge coupled device.

According to a further embodiment of the present invention there is provided a device manufacturing method comprising the following steps. Using an array of individually controllable elements to impart a beam of radiation with a pattern. Projecting the patterned beam of radiation onto a target portion of a substrate, the projected pattern comprising an array of radiation spots. Receiving at least one of the spots using an array of detector elements. Measuring the energy of the or each received spot and providing an output signal indicative of the energy of the or each received spot.

In one example, the method can further comprise receiving a plurality of spots simultaneously.

In one example, the method can further comprise effecting relative movement between the projected pattern and the array of detector elements such that the sensor system provides a plurality of indications of the energy of a received spot, and processing the plurality of indications such that the output signal is indicative of the average energy of the or each received spot.

In one example, the method can further comprise changing the state of at least one individually controllable element while providing the output signal, such that the output signal is indicative of the energy of the or each received spot for two or more states of the or each corresponding individually controllable element.

According to another embodiment of the present invention there is provided a device manufactured according to the method described above. Another embodiment provides a device manufactured using apparatus as described above. The device can, for example, be a flat panel display (FPD).

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the present invention and to enable a person skilled in the pertinent art to make and use the present invention.

FIG. 1 schematically depicts a lithographic apparatus, according to one embodiment of the present invention.

Figure 2:
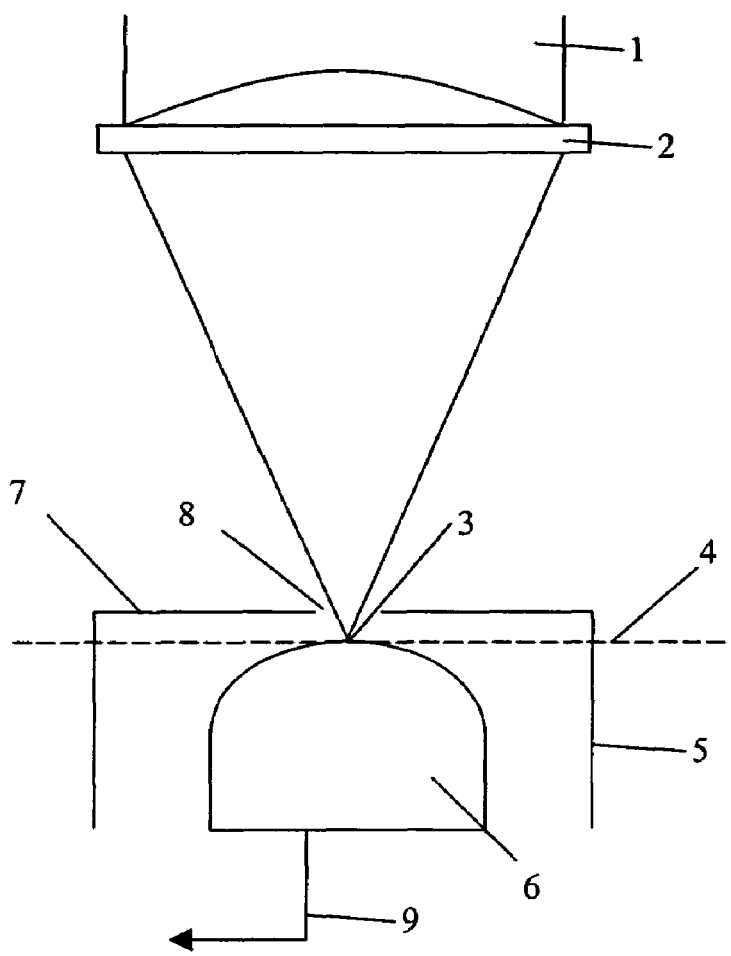

FIG. 2 schematically depicts a portion of a lithographic apparatus in cross section in combination with a dose sensor, according to one embodiment of the present invention.

Figure 3:
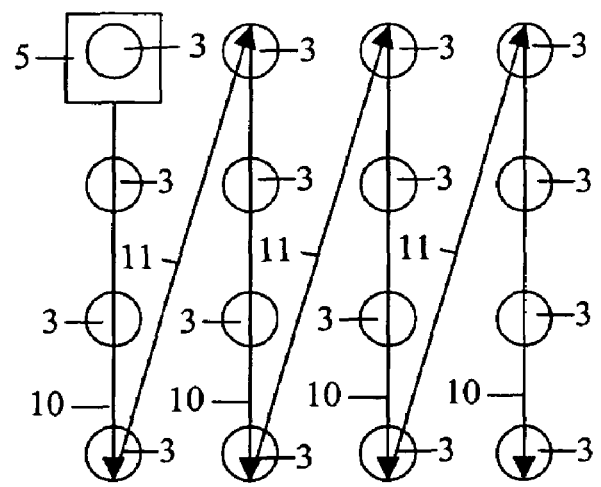

FIG. 3 schematically depicts a scanning pattern for the dose sensor of FIG. 2 across an array of spots projected onto a target plane, according to one embodiment of the present invention.

Figure 4:
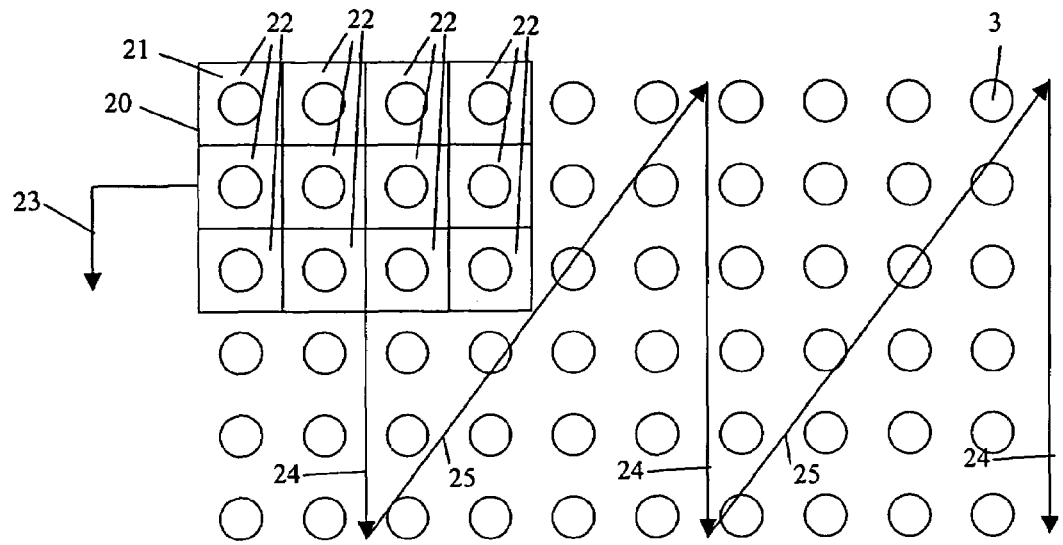

FIG. 4 schematically depicts a sensor system arranged to receive an array of spots projected onto a target plane, according to one embodiment of the present invention.

Figure 5:
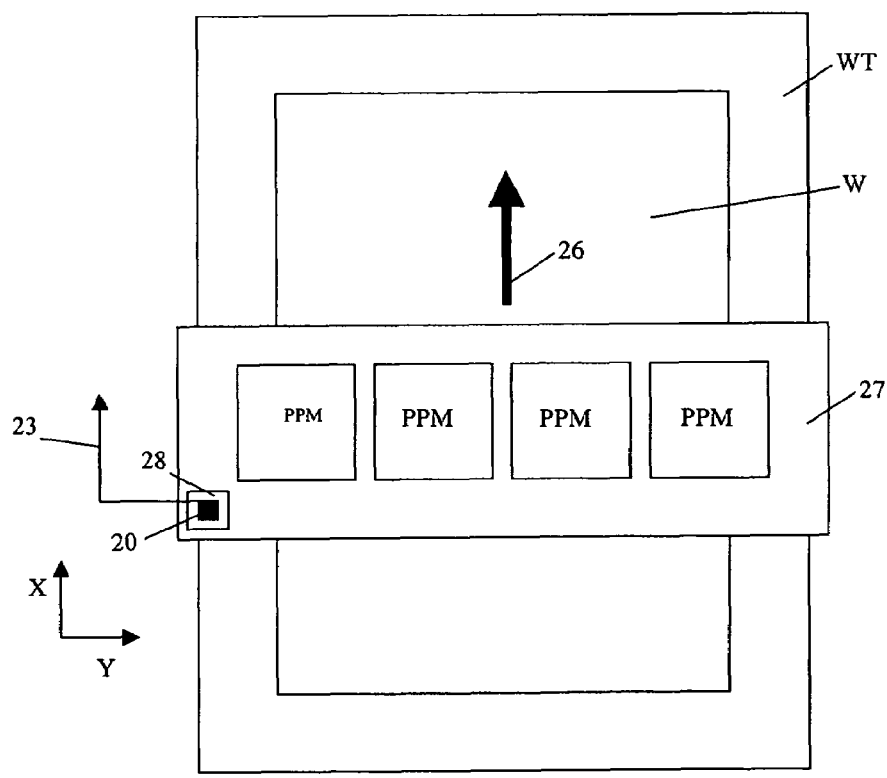

FIG. 5 schematically depicts in partial cross sectional plan view the lithographic apparatus of FIG. 1, according to one embodiment of the present invention.

Figure 6:
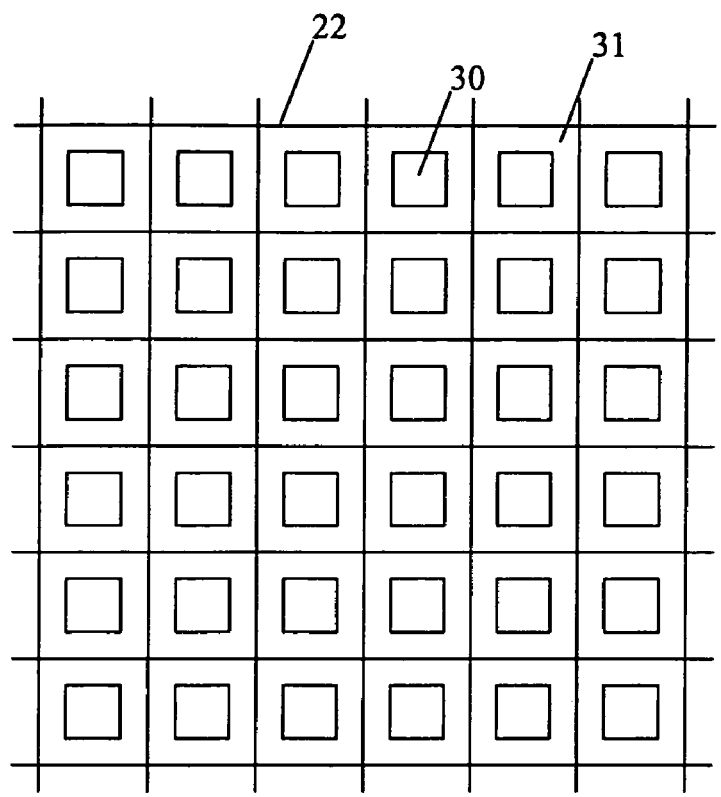

FIG. 6 schematically depicts an enlarged portion of part of a sensor system, according to one embodiment of the present invention.

Figure 7:
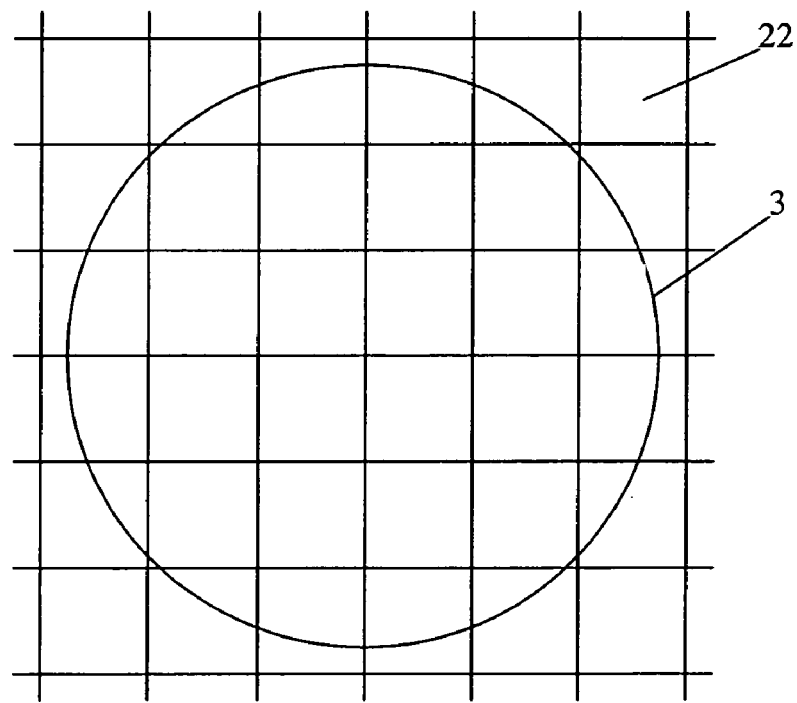

FIG. 7 schematically depicts an enlarged spot projected onto a portion of the sensor system, according to one embodiment of the present invention.

FIG. 8 schematically illustrates the relative sizes of parts of a lithographic apparatus, according to one embodiment of the present invention.

FIGS. 9 and 10 schematically illustrate first and second alternative portions of a sensor system for extending the focal length of a beam projected by the lithographic apparatus of FIG. 1, according to one embodiment of the present invention.

FIGS. 11 to 14 schematically illustrate four arrangements for increasing the accuracy of measurements of the energy of a beam projected by the lithographic apparatus of FIG. 1, according to various embodiments of the present invention.

Figure 15:
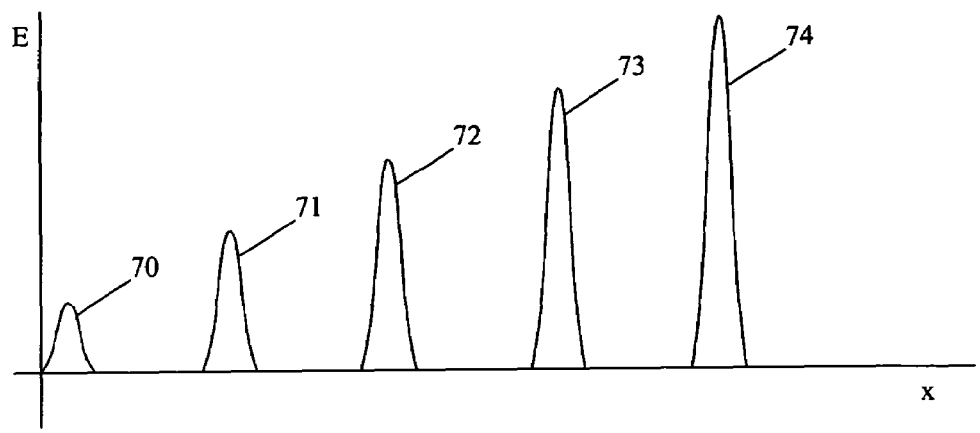
Figure 16:
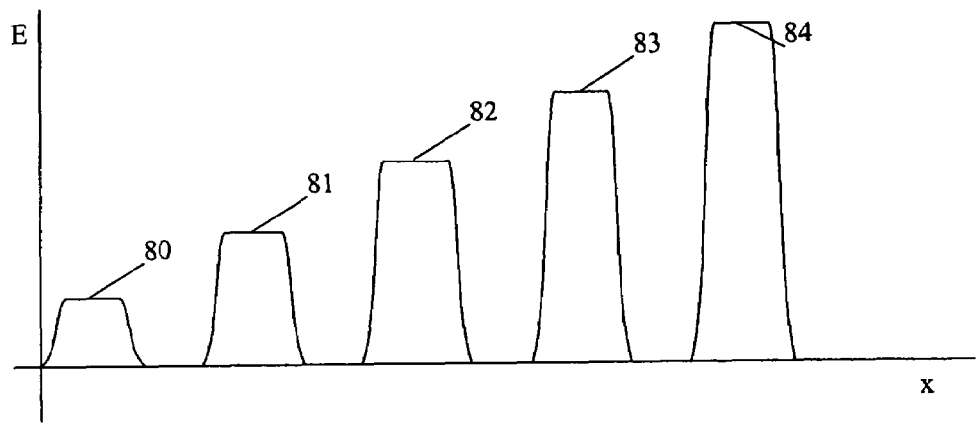
Figure 17:
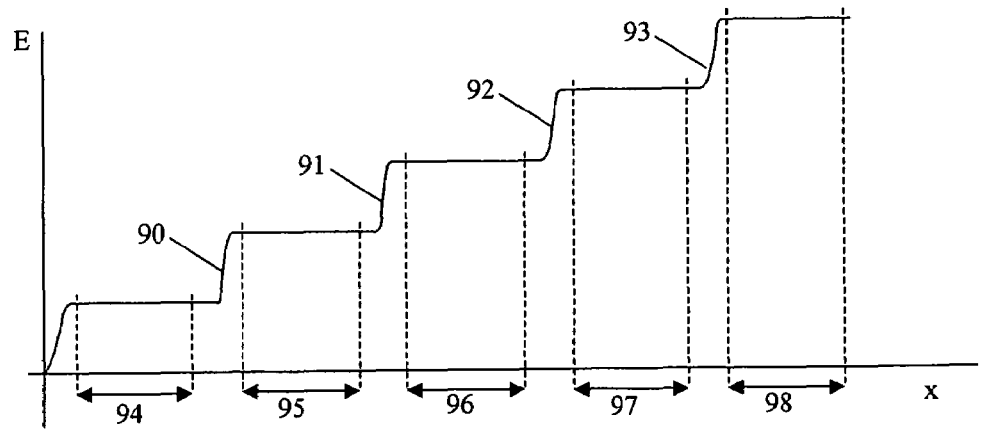

FIGS. 15 to 17 schematically illustrate three arrangements for calibrating a range of states of part of the lithographic apparatus of FIG. 1, according to various embodiments of the present invention.

Figure 18:
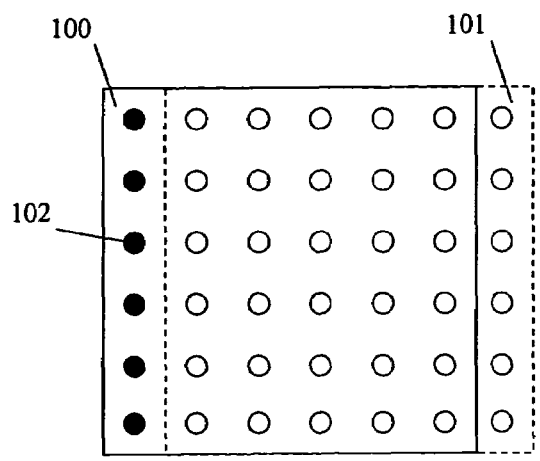
Figure 19:
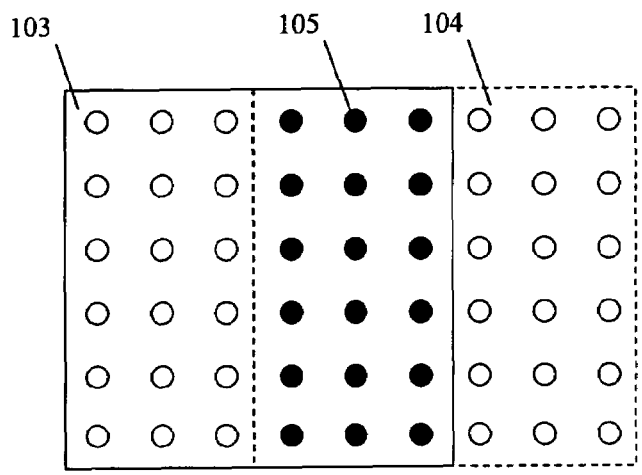
Figure 20:
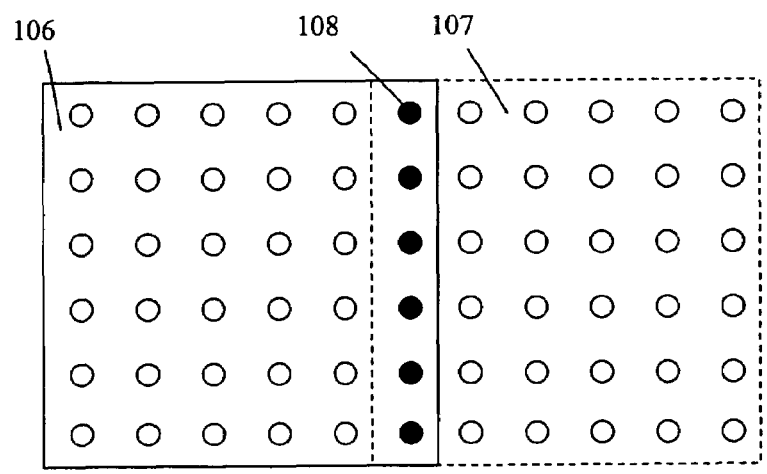

FIGS. 18 to 20 schematically illustrate three arrangements for increasing the accuracy of measurements of the energy of beams projected by the lithographic apparatus of FIG. 1, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

Overview and Terminology

The term "array of individually controllable elements" as here employed should be broadly interpreted as referring to any means that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning means include the following.

A programmable mirror array can comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface. It will be appreciated that, as an alternative, the filter can filter out the diffracted light, leaving the undiffracted light to reach the substrate. An array of diffractive optical micro-electro-mechanical system (MEMS) devices can also be used in a corresponding manner. Each diffractive optical MEMS device is comprised of a plurality of reflective ribbons that can be deformed relative to one another to form a grating that reflects incident light as diffracted light. A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated by reference herein in their entireties.

A programmable LCD array, an example of such a construction is given in U.S. Pat. No. 5,229,872, which is incorporated by reference herein in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat panel displays, thin-film magnetic heads, micro and non fluidic devices, print head, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein can be considered as synonymous with the more general term "projection system".

The illumination system can also encompass various types of optical components, including refractive, reflective, and catadioptric optical components for directing, shaping, or controlling the beam of radiation, and such components can also be referred to below, collectively or singularly, as a "lens".

The lithographic apparatus can be of a type having two (dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index, e.g., water, so as to fill a space between the final element of the projection system and the substrate. Immersion liquids can also be applied to other spaces in the lithographic apparatus, for example, between the mask and the first element of the projection system. Immersion techniques are well known in the art for increasing the numerical aperture of projection systems.

The lithographic apparatus can be an imprint lithography apparatus.

EXEMPLARY SYSTEM

FIG. 1 schematically depicts a lithographic projection apparatus according to a particular embodiment of the present invention. The apparatus comprises an illumination system (illuminator) IL, an array of individually controllable elements PPM (e.g., a programmable mirror array), a substrate table (e.g., a wafer table) WT, and a projection system ("lens") PL.

The illumination system (illuminator) IL provides a beam PB of radiation (e.g., UV radiation).

The array of individually controllable elements PPM (e.g., a programmable mirror array) applies a pattern to the beam. In general, the position of the array of individually controllable elements will be fixed relative to item PL. However, it can instead be connected to a positioning means for accurately positioning it with respect to item PL.

A substrate table (e.g., a wafer table) WT supports a substrate (e.g., a resist-coated wafer) W. A connected positioning means PW accurately positioning the substrate with respect to item PL.

A projection system ("lens") PL images a pattern imparted to the beam PB by the array of individually controllable elements PPM onto a target plane 4. Target portion C (e.g., comprising one or more dies) of the substrate W is arranged to be substantially coincident with the target plane 4. The projection system can image the array of individually controllable elements onto the substrate. Alternatively, the projection system can image secondary sources for which the elements of the array of individually controllable elements act as shutters. The projection system can also comprise a micro lens array (known as an MLA), e.g., to form the secondary sources and to image microspots onto the substrate.

As here depicted, the apparatus is of a reflective type (i.e., has a reflective array of individually controllable elements). However, in general, it can also be of a transmissive type, for example (i.e., with a transmissive array of individually controllable elements).

The illuminator IL receives a beam of radiation from a radiation source SO. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases, the source can be an integral part of the apparatus, for example when the source is a mercury lamp. The source SO and the illuminator IL, together with the beam delivery system BD if required, can be referred to as a radiation system.

The illuminator IL can comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the beam PB, having a desired uniformity and power distribution in its cross-section.

The beam PB subsequently intercepts the array of individually controllable elements PPM. Having been reflected by the array of individually controllable elements PPM, the beam PB passes through the projection system PL, which focuses the beam PB onto the target plane 4. In one example operation of the lithographic apparatus, target portion C of the substrate W is positioned in the X-Y plane such that the beam PB is projected onto the target portion C. With the aid of the positioning means PW (and interferometric measuring means IF), the substrate table WT can be moved accurately, e.g., so as to position different target portions C in the path of the beam PB. Where used, a positioning means (not shown) for the array of individually controllable elements can be used to accurately correct the position of the array of individually controllable elements PPM with respect to the path of the beam PB, e.g., during a scan. In general, movement of the object table WT is realized with the aid of a long-stroke module (course positioning) and a short-stroke module (fine positioning), which are not explicitly depicted in FIG. 1. A similar system can also be used to position the array of individually controllable elements. It will be appreciated that the beam can alternatively/additionally be moveable, while the object table and/or the array of individually controllable elements can have a fixed position to provide the required relative movement. As a further alternative, that can be especially applicable in the manufacture of flat panel displays, the position of the substrate table and the projection system can be fixed and the substrate can be arranged to be moved relative to the substrate table. For example, the substrate table can be provided with a system for scanning the substrate across it at a substantially constant velocity.

Although the lithography apparatus according to the present invention is herein described as being for exposing a resist on a substrate, it will be appreciated that the present invention is not limited to this use and the apparatus can be used to project a patterned beam for use in resistless lithography.

The depicted apparatus can be used in several modes:

1. Step mode: the array of individually controllable elements imparts an entire pattern to the beam, which is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. Scan mode: the array of individually controllable elements is movable in a given direction (the so-called "scan direction", e.g., the Y direction) with a speed v, so that the beam PB is caused to scan over the array of individually controllable elements. Concurrently, the substrate table WT is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

3. Pulse mode: the array of individually controllable elements is kept essentially stationary and the entire pattern is projected onto a target portion C of the substrate using a pulsed radiation source. The substrate table WT is moved with an essentially constant speed such that the beam PB is caused to scan a line across the substrate W. The pattern on the array of individually controllable elements is updated as required between pulses of the radiation system and the pulses are timed such that successive target portions C are exposed at the required locations on the substrate. Consequently, the beam can scan across the substrate W to expose the complete pattern for a strip of the substrate. The process is repeated until the complete substrate has been exposed line by line.

4. Continuous scan mode: essentially the same as pulse mode except that a substantially constant radiation source is used and the pattern on the array of individually controllable elements is updated as the beam scans across the substrate and exposes it.

Combinations and/or variations on the above described modes of use or entirely different modes of use can also be employed.

FIG. 1 further illustrates a sensor system 20. In one example operation, i.e., when the lithographic apparatus is arranged to project a pattern onto a target portion C of the wafer W, the sensor system 20 is out of the path of the beam from the projection system PL. However, in order to calibrate the array of individually controllable elements, the wafer W is moved out of the path of the beam PB to allow a calibration operation to take place. During a calibration operation the sensor system 20 is positioned such that an upper surface of the sensor system 20 is substantially coincident with the target plane 4 and positioned in the X-Y plane in the path of the beam from the projection system PL. Consequently, at least part of the pattern imparted to the beam PB illuminates the upper surface of the sensor system 20. The sensor system 20 is arranged to measure the energy of that portion of the pattern incident upon the sensor system.

FIG. 2 illustrates a schematic side view representation of a portion of the projection system PL of FIG. 1 in combination with a sensor system comprising a dose sensor for measuring the radiation energy of a single spot, according to one embodiment of the present invention. The patterned beam is focused, such that it forms a parallel patterned beam 1. The parallel patterned beam 1 illuminates a micro lens array (MLA). The MLA comprises an array of micro lenses 2 that correspond to the array of individually controllable elements PPM. For ease of description, only a single micro lens 2 is shown in FIG. 2. It is to be appreciated any number of mirco lenses can be used, based on an application the MLA is employed in. Each micro lens 2 focuses a portion of the patterned beam corresponding to an individual element within the array PPM to form an array of sub-beams, which project an array of spots 3 in the target plane 4. A single spot 3 corresponding to the single micro lens 2 is shown in FIG. 2. Other means for generating an array of sub-beams that project an array of spots in the target plane will be readily apparent to the appropriately skilled person. The present invention is not limited to the use of a micro lens array.

During a measurement operation, the dose sensor 5 is positioned to receive a single radiation spot 3. The dose sensor 5 comprises a photo diode 6 surrounded by a radiation proof screen 7. Within screen 7 there is a single pinhole 8. Pinhole 8 is dimensioned such that substantially only radiation within a single sub-beam can pass through the pinhole 8 to project a single spot illuminating the photodiode 6. The photodiode 6 measures the energy received from within the spot 3 and provides an output signal on output 9 indicative of the energy of the spot. Measurement of the energy of a spot provides a mechanism for calibrating the performance of the corresponding individually controllable element.

FIG. 3 schematically illustrates in plan view an array of spots 3 projected by the micro lens array (not shown in FIG. 3), according to one embodiment of the present invention. In order to measure the energy of each spot 3 the dose sensor 5 must be aligned with each spot in turn. This is achieved by scanning the dose sensor along each column of spots (indicated by arrows 10), before moving to the next column (indicated by arrows 11).

However, dose sensor 5 as described in combination with FIGS. 2 and 3 can suffer from a number of problems, as discussed above in the introduction. These problems can make it impractical to use such a dose sensor to calibrate an entire array of individually controllable elements. In particular, it is extremely time consuming to measure the energy of each spot one at a time.

FIG. 4 illustrates an apparatus for measuring the energy of an array of spots in the target plane, and hence calibrating the corresponding individually controllable elements, in accordance with one embodiment of the present invention. In place of the dose sensor of FIGS. 2 and 3, a sensor system 20 is positioned in the lithography system. The sensor system 20 comprises an array 21 of detector elements 22 that can be moved in the X and Y directions within the target plane 4. The array 21 of detector elements 22 intercepts a sample array of spots within the projected array of spots 3. Typically, the array of detector elements is two-dimensional.

In one example, the array 21 can comprises a charge coupled device (CCD), with each detector element 22 comprising a pixel of the CCD. As such, the term CCD as used herein should be interpreted as including the broader phrase "array of detector elements." Twelve spots are shown as being incident upon the CCD, out of a 10 by 6 array of spots. It should be appreciated, however, that in reality the total projected array of spots 3 can extend to many millions of spots. The sample array of spots incident upon the CCD can vary from a single spot up to the whole array of spots 3. For example, the sample array of spots is 24×16 spots or 30×30 spots. The sensor system is arranged to measure the energy of the whole of the sample array of spots substantially simultaneously during a measurement operation. This substantially simultaneous measurement provides a significant increase in throughput.

In one example, a calibration operation comprises at least one measurement operation. The position of the array of detector elements 21 can be moved between measurement operations such that a new sample array of spots is incident on the array of detector elements. The position of the array of detector elements 21 can also be moved during a measurement operation as further described below. The sensor system provides an output signal on output 23. The output signal gives an indication of the received energy for each spot.

In one example, a two dimensional array of detector elements is used to measure the energy of a plurality of spots, thus it may not be necessary to exclude radiation from other spots. This is because the stray radiation from other spots, if incident upon the CCD, will be spatially separated from the spots being measured. Consequently, stray radiation will be detected by separate detector elements. Therefore, this stray radiation can be filtered out and will not affect the results. As there is no need to exclude stray radiation from the array of detector elements and therefore no pinholes, the required accuracy in aligning the sensor system with the array of spots is reduced.

FIG. 4 illustrates each spot 3 incident upon the CCD 21 being contained entirely within a single detector element (CCD pixel) 22, according to one embodiment of the present invention. For example, CCD cameras can have detector elements measuring between 4×4 µm and 8.4×9.8 µm or higher. The array of detector elements can have 768 rows and 494 columns of detector elements. This gives a typical total useable area of approximately 6.4×4.8 mm.

In one example, each spot can have a diameter on the focal plane 4 of about 1.5-2 µm. In one example, each spot can be separated from its nearest neighbors by about 200-250 µm, for instance 225 µm. In FIG. 4, the diameter of each spot, relative to the size of each CCD detector element 22 and the distance between spots, is exaggerated for clarity. It will be readily apparent that there can be many un-illuminated detector elements 22 between those illuminated by a spot 3.

In one example, after each measurement operation, the array of detector elements is moved by a sensor scanning system (not shown in FIG. 4) for the next measurement operation, such that it scans along a number of columns (indicated by arrows 24). After each group of columns has been scanned, the array of detector elements moves to the start of a new group of columns (indicated by arrows 25). It will be appreciated that in between measurement operations the array of detector elements can be scanned across the array of spots 3 in any direction. Alternatively, the array of detector elements can be moved to a new position for the next measurement operation leaving a gap from the position during the preceding measurement operation. It will be further appreciated that each calibration operation can comprise any number of measurement operations. A calibration operation can be such that the energy of the entire array of spots is measured or alternatively only part of the array of spots can be measured.

FIG. 5 illustrates in partial plan view a lithographic apparatus suitable for use in the fabrication of flat panel displays incorporating a sensor system 20, in accordance with one embodiment of the present invention. Wafer table WT supports wafer W. Wafer W is arranged to be passed under bridge 27 in the X direction, as indicated by arrow 26. Bridge 27 supports a plurality of arrays of individually controllable elements PPM (four are illustrated by way of example) arranged to fully expose the width of wafer W in the Y direction. In normal operation of the lithographic apparatus, as wafer W passes under bridge 27 each array PPM projects an array of spots onto the target surface of the wafer W. The target surface of wafer W is substantially coincident with the target plane for the projection system PL. It will be appreciated that the lithographic apparatus could only have one array of individually controllable elements PPM.

The sensor scanning system 28 is arranged to move the sensor system 20, incorporating the array of detector elements (CCD) (not explicitly shown in FIG. 5) in the X and Y directions within the focal plane 4 such that a sample array of spots 3 is focused onto the CCD. The CCD measures the received energy for each spot in the sample array of spots. An output signal from the sensor system 20 provides an indication of the received energy for each spot. The output signal is supplied on output 23. The output signal can be further processed in an external computing device (not shown). The output signal can, for example, be used to control the beam PB, the array of individually controllable elements PPM, and the pattern delivered to the array of individually controllable elements PPM. In this example, the feedback mechanism allows the lithographic apparatus to compensate for malfunction or degradation in the operation of the array of individually controllable elements PPM or the projection system PL. This helps ensure that in normal operation the lithographic apparatus accurately reproduces the desired pattern on the target portion of the wafer W.

In one example, a calibration operation can periodically calibrate the entire array of spots during which time normal operation of the lithographic apparatus is suspended. Alternatively, a calibration operation can be an ongoing process in which measurement operations take place during gaps in the normal operation of the lithographic apparatus. The latter arrangement typically takes longer than an uninterrupted calibration operation.

As with the dose sensor 5 depicted in FIG. 2, in order to measure the received energy of a single spot, and hence calibrate a single individually controllable element, each sample array of spots must be projected onto the array of detector elements 21 for a minimum period of time. For example, using a dose sensor 5 it can take about 3.5 hours to calibrate a typical array of individually controllable elements. In one example, an array of detector elements can measure the energy of a sample array of about 24×16 spots during each measurement operation. Therefore, the time taken to calibrate the same typical array of individually controllable elements will take about 3.5 hours/24/16=32.8 s. Clearly this reduction in time is advantageous as it reduces the period of time for which normal operation of the lithographic apparatus is interrupted.

In one example, the output signal comprises a matrix of values, each value corresponding to the received energy for each detector element. The output signal can be the total received energy for each detector element during each measurement operation. In one example, the average power received by each detector element can be calculated by dividing the received energy by the duration of the measurement operation. Alternatively, the output signal can have an associated time signal indicating the time during the measurement operation at which each portion of the energy was received. After the energy for the first sample array of spots has been measured (i.e., at the end of the first measurement operation) the array of detector elements 21 is moved to a new position (which can overlap with a previous position) and the energy for a new sample array of spots is measured.

FIG. 6 schematically illustrates an enlarged portion of the array of detector elements 21, according to one embodiment of the present invention. Each detector element 22 comprises an optically active portion 30 and an optically dead portion 31. The optically active portion 30 is the part of each detector element 22 that is able to detect incident radiation. Any radiation incident upon the optically dead portion 31 will not be detected. As such, this can be a source of inaccuracy in measuring the received radiation energy for each spot 3 depending upon the exact alignment between the projected array of spots and the array of detector elements. The array of detector elements 21 has a fill factor defined as the proportion of the surface area of each detector element that is optically active. In one example, the fill factor is about 80%.

FIG. 7 illustrates one embodiment of the present invention in which inaccuracies in the measurement of received radiation energy due to the optically dead portions are minimized. Each spot is defocused before it is incident upon the array of detector elements 21, such that the projected radiation spot covers a plurality of detector elements 22. For instance the spot 3 can be defocused to a diameter of approximately 10 µm.

In one example, the received energy measured for all of the detector elements covered by each spot 3 is added together. The total received energy is then divided by the fill factor to account for radiation incident upon optically dead areas. Given a sufficiently large number of detector elements exposed by each spot, this improves the accuracy of the measurements by averaging out losses due to the optically dead portions. As the spot is defocused, the total received energy across the enlarged spot will be the same as the energy contained within the same spot focused to its normal size. Defocusing each spot allows for it to be no longer necessary to align the array of spots such that each spot falls exactly within a single detector element 22. This reduces the complexity and the required accuracy of the sensor scanning system.

In one example, a CCD is typically covered by a transparent quartz layer, which serves to protect the detector elements from damage. The quartz layer 40 is around 1 mm thick. This is comparable to the focal length 41 of the beam from each micro lens 2, as shown in FIG. 8. In this example, in order to focus each spot onto the array of detector elements 21, a lithographic apparatus incorporating an MLA the sensor system 20 further comprises at least one lens arranged to extend the focal length of the sub-beams from the MLA.

FIGS. 9 and 10 schematically illustrate first and second alternative portions of a sensor system for extending the focal length of a beam projected by the lithographic apparatus of FIG. 1, according to one embodiment of the present invention.

FIG. 9 illustrates a first arrangement for extending the focal length of each sub-beam, according to one embodiment of the present invention. The converging beam 42 emerging from micro lens 2 is allowed to go beyond its focal point 43, such that it becomes a divergent beam 44. A converging lens 45, having a longer focal length 46 than the focal length 41 of the micro lens 2 focuses beam 47 onto an upper surface 48 of the CCD 21, passing through the quartz layer 40.

FIG. 10 illustrates a second arrangement for extending the focal length, according to one embodiment of the present invention. Converging beam 42 emerging from micro lens 2 passes through a diverging lens 49. This reduces the degree of convergence of beam 42, such that emergent beam 51 has a longer focal length 50 than the focal length 41 of micro lens 2. Beam 51 is focused onto an upper surface 48 of the CCD 21, passing through the quartz layer 40.

The lens used to extend the focal length of the beam from the micro lens can be combined with the optics required to defocus the spot 3, as described above in connection with FIG. 7. For example, this can be achieved by altering the position of the CCD 21 such that the upper surface 48 is at position 52 for example (i.e., no longer at the focal point). There can be a separate lens for each sub-beam. Alternatively, a single lens can be arranged to defocus and extend the focal length of the whole of the array of sub-beams.

Alternative methods of defocusing the spots, and extending the focal length of the sub-beams will be readily apparent to a skilled artisan from the teaching herein.

In one example, in order to improve the accuracy of the measurement of the energy for each spot it is desirable to increase the area of the array of detector elements 21 that is illuminated by each spot. This is because the sensitivity of a CCD can vary from one portion of the array to another. Additionally, this further minimizes any inaccuracies due to the dead spaces 31 within the detector elements.

Figure 11:
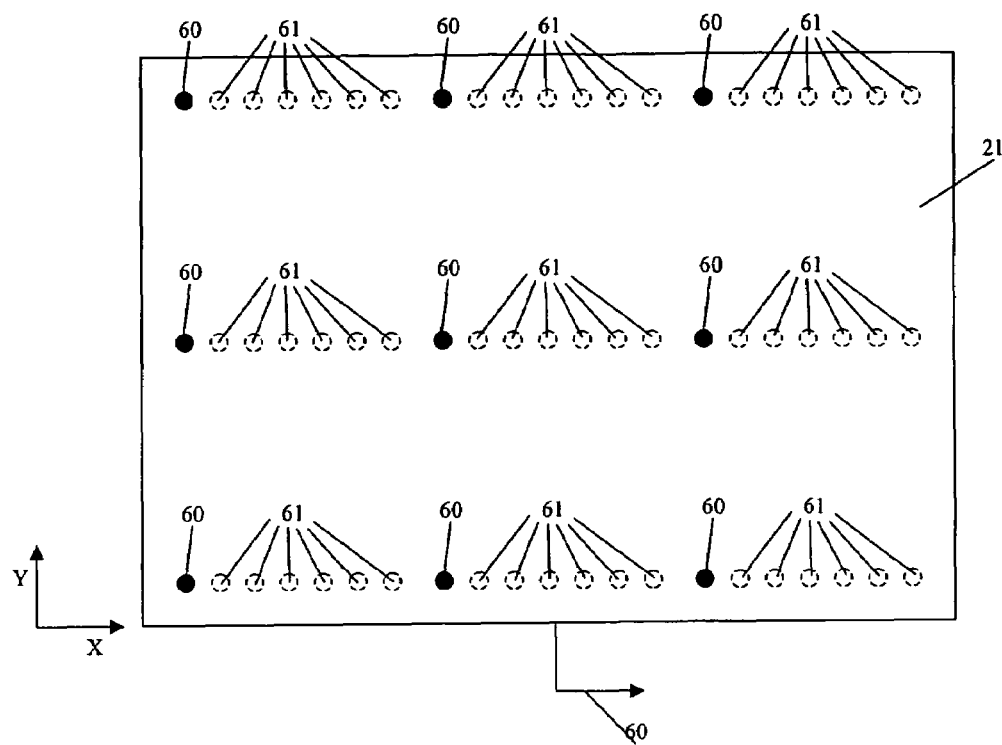

This increase in the area of the array of detector elements illuminated by each spot can partly be achieved by defocusing each spot as described above in connection with FIG. 7. Alternatively, or in addition a number of images of each spot can be projected onto the surface of the CCD 21 during a single measurement operation. FIG. 11 illustrates this technique, according to one embodiment of the present invention.

FIGS. 11 to 14 schematically illustrate four arrangements for increasing the accuracy of measurements of the energy of a beam projected by the lithographic apparatus of FIG. 1, according to various embodiments of the present invention.

FIG. 11 shows CCD 21 moved to a first position in which a sample array of nine spots is projected onto the CCD creating a first spot image 60 (indicated by the dark circles), according to one embodiment of the present invention. The beam PB is then turned off and the sensor scanning system moves the CCD to a new position, such that the same sample array of nine spots is still projected onto the CCD, but with a slight offset from the first position. The beam PB is switched on again to project a repeat spot image 61 of the same sample array of spots onto the CCD. This process can be repeated a number of times to create a plurality of repeat spot images 61 for each spot in the sample array of spots. The received radiation energy each spot image is measured by the CCD 21. The CCD keeps integrating throughout each measurement operation. Once all of the images for each spot have been recorded the output signal on output 23 is indicative of the average energy received across the array for all of the spot images of each spot.

The shift in position of the CCD from one image of the sample array of spots to the next can be such that each spot image is adjacent to the previous image. Alternatively, a gap between images can be left as shown in FIG. 11. For example, for a sample array of spots in which the diameter of spots is about 1.5 µm and the gap between spots is about 225 µm, the CCD can be offset by about 30 µm in the X direction between each image of the array of spots. Seven images of each spot can be measured during each measurement operation before the CCD. It will be appreciated that the above described scanning pattern is merely exemplary and the array of detector elements 21 can be offset in any direction by any amount and any number of images of the same spot can be measured during each measurement operation.

The output signal indicating the energy for each detector element can be output continuously from the CCD. Alternatively, the CCD can record the total or average energy received by each detector element throughout each measurement operation and output this information or a calculated average power signal in a batch at the end of each measurement operation. This batch output of the output signal is timed to coincide with the CCD moving to a new starting position for the next measurement operation in the calibration operation. For an implementation of a sensor system as described above it can take approximately 40 ms to output the batch output signal from the CCD. However, it takes about 50 ms to move the CCD to a new X and Y position for the next measurement operation. Therefore, the output signal is always able to keep up during a calibration operation.

Figure 12:
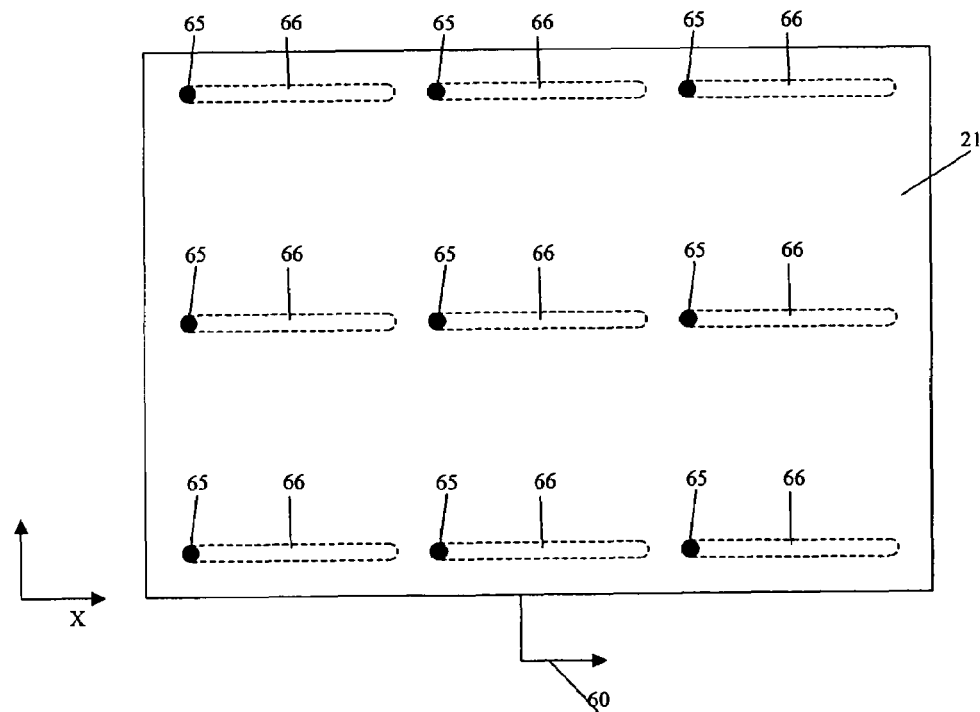

As shown in FIG. 12, as an alternative for increasing the area of the CCD exposed by each spot, the CCD can be moved while the beam PB continuously illuminates the array of individually controllable elements. Consequently, each spot from the micro lens array projects a continuously illuminated stripe of radiation along the surface of the CCD. The initial position of each spot is indicated by the solid circles 65. The CCD 21 is scanned parallel to the X direction such that a stripe 66 corresponding to each spot is projected onto the surface of the CCD 21.

As with FIG. 11, the output signal provides an indication of the total received energy for each spot. Each stripe will be about 100-150 µm long, with the width of each stripe determined by the diameter of the equivalent spot.

In one example, the continuously illuminated stripes of radiation 66 illuminating the CCD do not overlap. This is because in the simplest implementation the received energy for each detector element is integrated over time for the entire measurement operation to form the output signal at the end of each measurement operation. However, it is desirable to increase the total area of the CCD exposed by each spot by extending the length of each stripe in order to minimize errors.

Figure 13:
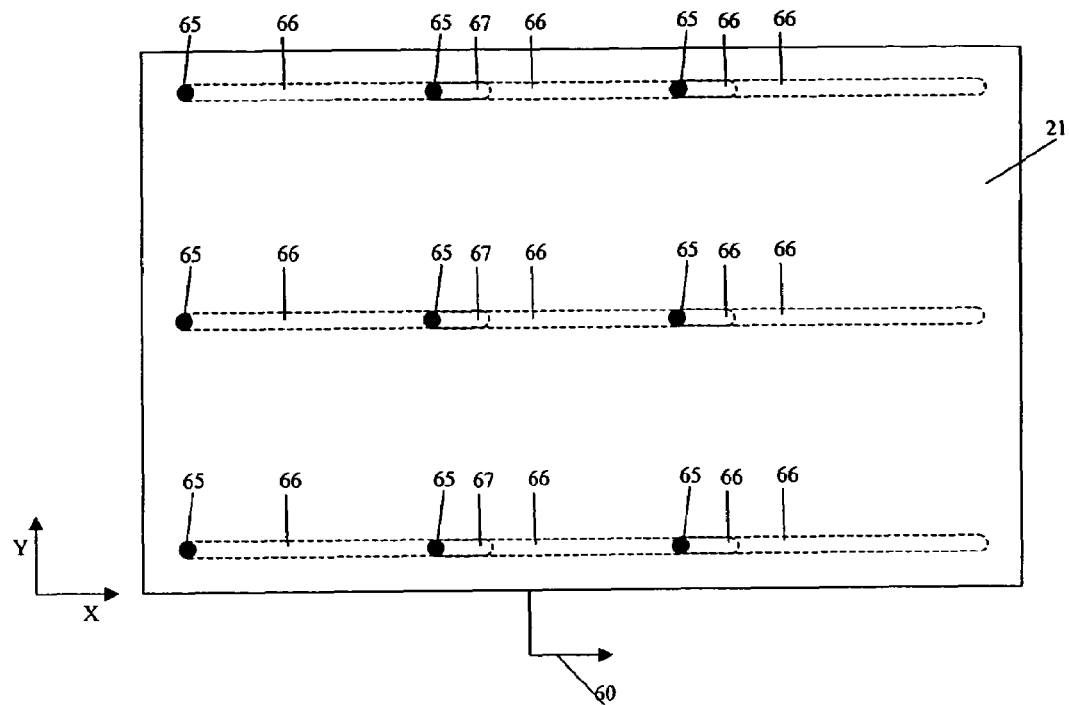

As seen in FIG. 13, by recording information relating to the time at which each detector element receives radiation energy from each spot, overlapping stripes can be differentiated when calculating the average energy for each spot. Each stripe 66 overlaps the start of the stripe immediately to its right in the X direction. However, the areas of overlap 67 are illuminated by the respective spots at different times during the measurement operation (towards the beginning and towards the end respectively). Therefore, by recording the time at which each detector element receives radiation energy, each portion of received energy can be assigned to the appropriate sub beam.

Figure 14:
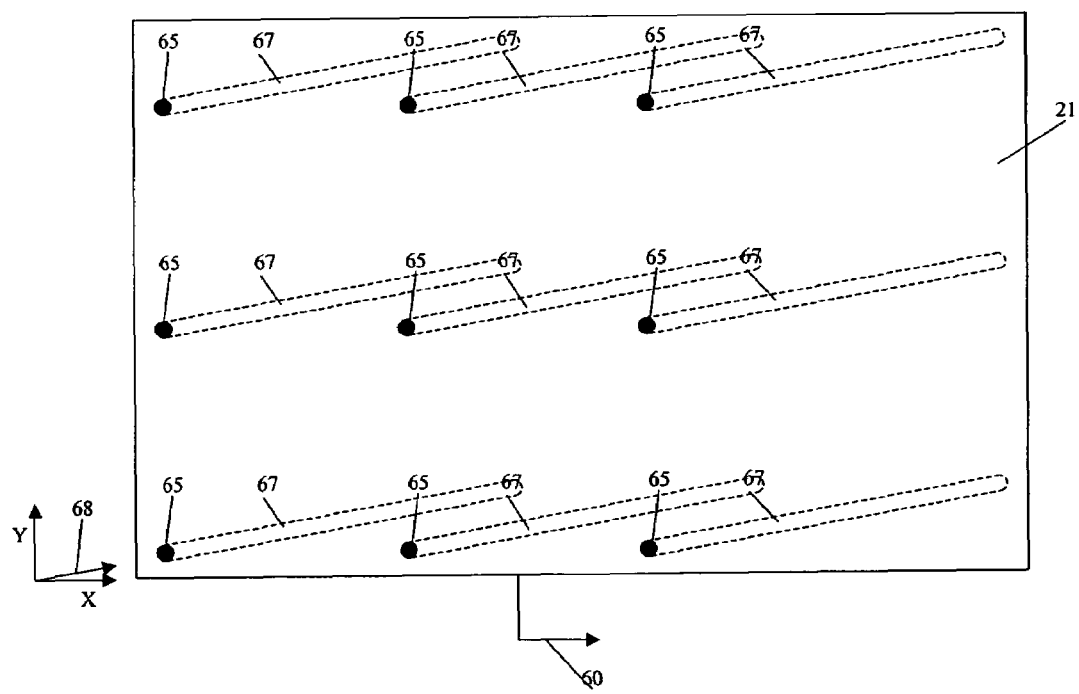

One arrangement for maximizing the length of stripes without them overlapping is illustrated in FIG. 14. In FIG. 14, the CCD 21 is not scanned parallel to the X or Y directions, rather it is scanned at a shallow angle to the X axis, parallel to arrow 68. Consequently the stripes 66, although longer than the gap between the spots run diagonally and do not overlap. It will be appreciated that the maximum length of each non-overlapping stripe 67 in this arrangement is dependent upon the diameter of the spots and the size of the gap between spots in the target plane.

As mentioned above, each element within the array of individually controllable elements PPM is controlled by a control signal supplied to that element. The control signal determines what state the element is in. The state of the element determines how much radiation the element reflects or transmits towards the target plane. Consequently, the state of each element controls the energy within the corresponding spot projected onto the target plane. In one example, the control signal is a digital signal, such that each element can be set to one of a number of discrete states between fully on and fully off. For example, with an 8-bit control signal, each element can be set to any one of 256 different states, such that the energy reflected or transmitted is different for each state.

In one example, it is desirable to be able to calibrate the ability of an individually controllable element to respond correctly to a changing control signal. This can be measured by carrying out a measurement operation for each spot or sample array of spots as described above a number of times, each time with the control signal set to a different value. However, as further described above in connection with FIGS. 11-14, the area of the CCD illuminated by each spot during each measurement operation can be increased in order to improve the accuracy of the measurement of the average energy for each spot. This can be combined with measurement of the energy for a plurality of element states by varying the state during each measurement operation. During each measurement operation it can be that only a subset of the possible states for the sample array of spots are measured. The remaining states for each sample array of spots can be measured during further measurement operations. Depending upon the required results during a calibration operation a subset of the array of spots can be measured for all possible states of the corresponding individually controllable elements. Alternatively, a subset of the possible states can be measured for all spots, or somewhere between these two extremes. All of these arrangements reduce the amount of data generated and the time taken compared with measuring all possible states for all spots.

FIGS. 15 to 17 schematically illustrate three arrangements for calibrating a range of states of part of the lithographic apparatus of FIG. 1, according to various embodiments of the present invention.

FIG. 15 is a graph plotting received radiation energy E against position along the X-axis of the CCD for a single spot. The X-axis is chosen as an example situation in which the CCD is moved by the sensor scanning system along the X-axis between repeated measurements of the sample of spots. It will be readily apparent from the above description that the CCD can be scanned in any direction.

A single image of each spot is projected onto the CCD. The beam is then switched off and the CCD moved to a new position along the X-axis before the beam is switched on again and a second pulse is supplied. Each image of the spot is projected as in FIG. 11. However, in the case of FIG. 15, between each pulse from the beam PB the state of the corresponding individually controllable element is changed resulting in a series of spots 70-74 spaced apart along the X-axis at different energy levels.

Each spot 70-74 is plotted as being an approximately normal distribution of energy about a peak energy at the center of each spot. However, in practice the distribution of energy can differ. In FIG. 15 each spot is illustrated as having a larger peak energy than the last in the X-direction. However, the order of magnitude of spots can differ, i.e., the corresponding element can be changed to any state between pulses of the beam. The average energy for each state can be calculated by measuring the energy received by the detector elements for each spot and dividing by the time for which each spot was exposed.

FIG. 16 illustrates an alternative arrangement for calibrating the average energy received for a spot for a number of different states of the individually controllable element. In FIG. 16 a separate stripe 80-84 of radiation is projected onto the CCD for each state of the corresponding element. The CCD is arranged to be scanning in the X direction. Between each stripe the beam is switched off and the state of the element is changed. The average received energy for each stripe 80-84 is calculated as described in connection with FIG. 12.

FIG. 17 illustrates a third alternative arrangement for calibrating the energy received for a number of different states of the corresponding individually controllable element. As with FIG. 16, the CCD continuously scans in the X direction. However, for FIG. 17 the beam is not switched off when the state of the corresponding element is changed at points 90-93. This results in a continuous stripe of radiation projected onto the surface of the CCD. The average energy for each state can be calculated by splitting the stripe into a number of sections 94-98, during which the state is constant, and calculating the average received energy over that area of the stripe.

As described above, the array of detector elements (CCD) is typically arranged to measure a sample array of spots from the whole array of spots during each measurement operation. After the sample array has been measured the CCD is moved to a new position within the target plane to measure the average energy for a new sample array of spots in the next measurement operation. This new CCD position can be sufficiently offset from the first position that there is no overlap between the two sample arrays of spots. However, the accuracy of the CCD is not necessarily uniform over time. Therefore, in one embodiment of the present invention there is some degree of overlap in CCD position from one measurement operation to the next such that the energy for at least some of the spots is measured twice. This is desirable because it allows direct comparison of measurements of the same spot from one measurement operation to the next.

FIGS. 18 to 20 schematically illustrate three arrangements for increasing the accuracy of measurements of the energy of beams projected by the lithographic apparatus of FIG. 1, according to various embodiments of the present invention.

FIG. 18 schematically illustrates a first arrangement in which the CCD is moved from a first position 100 to a second position 101. All but one column of spots 102 (indicated by solid circles) are measured during the first and the second measurement operations. For the remaining spots, any difference between the first and second energy measurement can be calculated and either used to provide an average energy measurement or alternatively used to detect malfunction of the CCD. All further movements of the CCD are arranged such that there is only one column/row of spots difference from the previous CCD position.

Repeated measurement of the same spots generates a much increased volume of data. In order to measure all of the spots in the array of spots, with repeated measurements of each spot, within a reasonable period of time a faster output from the CCD is necessary. For instance, the amount of data generated when each new CCD position is offset from the previous CCD position can require that the CCD output operates at 25 Hz. If each new CCD position overlaps the previous CCD position by all but one column/row, an output speed of the order of 500 Hz is desirable.

FIG. 19 schematically illustrates a second arrangement in which the difference in position from a first CCD position 103 to a second CCD position 104 is equal to half of the sample array of spots. In this way each spot is measured twice, while reducing the total amount of data generated.

FIG. 20 schematically illustrates a third arrangement in which the difference from a first CCD position 106 to a second CCD position 107 is such that only one column of spots 108 (indicated by solid circles) is measured twice. The average difference in the measured energy for the spots within the overlapped column is used to calculate a correction factor between the two sets of measurements. This correction factor can be used to correct the remaining energy measurements to ensure consistency of results between the two measurement operations.

When measuring the received energy in a spot in order to calibrate the performance of an individually controllable element it is desirable that the energy of the beam is kept constant. This can be achieved by using an energy sensor to measure the energy of the beam before it illuminates the array of individually controllable elements, and then using this measured value as a feedback parameter to control the energy of the beam generated by the illumination system IL.

In one example, because the sensor system comprises an array of detector elements there is no requirement for exactly aligning the sensor system with each spot. This significantly reduces the complexity of the sensor system and reduces the time taken to measure the energy of each spot.

In one example, the energy of a plurality of spots can be measured simultaneously, reducing the time required to measure all of the spots within the array.

In one example, the accuracy of the measurement of the energy of each spot can be increased by increasing the area of the array of detector elements illuminated by each spot. In one embodiment of the present invention each spot can be measured for a number of different states of the corresponding individually controllable element during a single measurement operation.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

What is claimed is:

1. A lithographic apparatus, comprising:
an illumination system that supplies a beam of radiation;
an array of individually controllable elements that pattern the beam;
a projection system that projects the patterned beam onto a target plane, the patterned beam comprising an array of radiation spots;
a substrate table for supporting a substrate, such that a target surface of the substrate is substantially coincident with the target plane; and
a sensor system comprising an array of detector elements arranged to receive at least one of the spots and a sensor scanning system arranged to move the array of detector elements from a first sampling position to at least a second sampling position, the sensor system measuring energy of the at least one spot and providing an output signal indicative of the energy of the at least one received spot.

2. The apparatus of claim 1, wherein:
the array of detector elements receives a plurality of the spots;
the sensor system measures energy of each of the plurality of received spots; and
the output signal is indicative of the energy of each of the plurality of received spots.

3. The apparatus of claim 2, wherein the projection system and the sensor system are arranged such that each of the plurality of spots illuminates a respective one of a plurality of detector elements.

4. The apparatus of claim 1, wherein the state of at least one individually controllable element is variable and the energy of a respective one of the at least one spot is dependent upon the state, such that the output signal is indicative of the energy the at least one spot for two or more states of the at least one individually controllable element.

5. The apparatus of claim 1, wherein the projection system and the sensor system are arranged such that each spot illuminates a single respective detector element.

6. The apparatus of claim 1, wherein at least one of the projection system and the sensor system adjusts the area of the array of detector elements illuminated by the at least one spot, such that the at least one spot illuminates a plurality of detector elements and the output signal is indicative of the average energy of the at least one spot.

7. The apparatus of claim 6, wherein at least one of the projection system and the sensor system adjusts a size of the at least one spot.

8. The apparatus of claim 6, wherein at least one of the projection system and the sensor system moves, such that the at least one spot is projected onto the array of detector elements to illuminate a plurality of discrete images of the at least one spot.

9. The apparatus of claim 6, wherein at least one of the projection system and the sensor system moves, such that the at least one spot is projected onto the array of detector elements to form a continuously illuminated stripe.

10. The apparatus of claim 9, wherein the direction of relative movement between the projection system and the sensor system is at an angle to an axis of the projected array of spots.

11. The apparatus of claim 6, wherein the sensor system adjusts the output signal with a correction factor corresponding to the proportion of the surface area of the array of detector elements capable of detecting incident radiation.

12. The apparatus of claim 1, wherein a first plurality of the spots are received by the array of detector elements in the first sampling position and a second different plurality of the spots are received by the array of detector elements in the second sampling position.

13. The apparatus of claim 1, wherein at least some of a first plurality of the spots received by the array of detector elements in the first sampling position form part of a second plurality of the spots received by the array of detector elements in the second sampling position.

14. The apparatus of claim 1, wherein the sensor system further comprises a beam measurement device that provides a signal indicative of the energy of the beam, the sensor system using the signal indicative of the energy of the beam to adjust the output signal.

15. The apparatus of claim 1, wherein the lithographic apparatus comprises a plurality of arrays of individually controllable elements.

16. The apparatus of claim 1, wherein the array of detector elements comprises a charge coupled device.

17. A device manufacturing method, comprising:
using an array of individually controllable elements to pattern a beam of radiation;
projecting the patterned beam onto a target portion of a substrate, the projected pattern comprising an array of radiation spots;
receiving at least one of the spots using an array of detector elements;
measuring the energy of the at least one spot; and
effecting relative movement between the projected pattern and the array of detector elements, such that the sensor system provides a plurality of indications of the energy of the at least one received spot.

18. The method according to claim 17, further comprising receiving a plurality of spots substantially simultaneously.

19. The method according to claim 17, further comprising:
processing the plurality of indications, such that the output signal is indicative of the average energy of the at least one received spot.

20. The method according to claim 17, further comprising changing the state of at least one individually controllable element while providing the output signal, such that the output signal is indicative of the energy of the at least one received spot for two or more states of the or each corresponding individually controllable element.

* * * * *